US007787238B2

(12) United States Patent
Liao et al.

(10) Patent No.: US 7,787,238 B2
(45) Date of Patent: Aug. 31, 2010

(54) POWER SUPPLY ADAPTER

(75) Inventors: Yong-Jun Liao, Tu-Cheng (TW); Guo-Qiang Tang, Tu-Cheng (TW); Yu-An Feng, Tu-Cheng (TW)

(73) Assignee: Cheng Uei Precision Industry Co., Ltd., Tu-Cheng, Taipei Hsien (TW)

( * ) Notice: Subject to any disclaimer, the term of this patent is extended or adjusted under 35 U.S.C. 154(b) by 150 days.

(21) Appl. No.: 12/181,685

(22) Filed: Jul. 29, 2008

(65) Prior Publication Data

US 2010/0027197 A1 Feb. 4, 2010

(51) Int. Cl.
*H05K 7/00* (2006.01)

(52) U.S. Cl. .................. 361/679.01; 361/625; 361/752; 439/76.2; 439/131; 174/50; 363/142

(58) Field of Classification Search ................. 361/622, 361/752, 760, 761, 772, 773, 600, 601, 679.01, 361/748
See application file for complete search history.

(56) References Cited

U.S. PATENT DOCUMENTS 5,829,993 A * 11/1998 Wu ............................ 439/131
6,126,460 A * 10/2000 Wu ............................ 439/131
6,275,002 B1 * 8/2001 Chen .......................... 320/111
6,544,051 B1 * 4/2003 Su ............................ 439/131
6,548,755 B2 4/2003 Wu
6,644,984 B2 * 11/2003 Vista et al. ................. 439/76.1
6,659,782 B2 * 12/2003 Wu ............................ 439/131
7,001,196 B1 * 2/2006 Huang ......................... 439/320
7,172,436 B2 * 2/2007 Uezono ..................... 439/76.2
7,344,385 B2 * 3/2008 Chen ........................... 439/74

* cited by examiner

*Primary Examiner*—Jayprakash N Gandhi
*Assistant Examiner*—Courtney Smith
(74) *Attorney, Agent, or Firm*—Muncy, Geissler, Olds & Lowe, PLLC

(57) ABSTRACT

A power supply adapter includes a casing defining at least one inserting groove therein, at least one resilient piece disposed in the casing and having a locating portion and a resisting portion extended gradually upward from the locating portion, and a plug module rotatablely disposed in the casing. The plug module has at least one retaining block disposed in the inserting groove of the casing and capable of rotating around the resisting portion of the resilient piece. A connecting terminal runs through the retaining block to form an inserting portion and a projecting portion at opposite sides of the retaining block. The projecting portion is capable of compressing the resisting portion when the inserting portion is raised erectly to be exposed externally from the inserting groove.

12 Claims, 5 Drawing Sheets

POWER SUPPLY ADAPTER

BACKGROUND OF THE INVENTION

1. Field of the Invention

The present invention generally relates to a power supply adapter, and more particularly to a power supply adapter with a foldable plug module.

2. The Related Art

A power supply adapter is widely used in many electronic devices for converting alternating current (AC) power into direct current (DC) power so as to supply the required DC power to operate or charge the electronic devices.

A conventional power supply adapter is disclosed in U.S. Pat. No. 6,548,755. According to disclosure of the patent, the power supply adapter includes a first casing, a second casing, a rotatable cylinder and a projecting plug. The first casing defines a cavity at a front end thereof. Two vertical plates are mounted on the second casing for supporting the rotatable cylinder. The projecting plug is formed on a front end of the rotatable cylinder and extends from a cavity space defined by the front end of the first casing and the second casing. By rotating the rotatable cylinder, the angle of the projecting plug is changed.

However, the power supply adapter of this type fails to locate the projecting plug stably in place when the projecting plug is raised to mate with other electronic apparatus, thus leading to unstable connection between the projecting plug and the electronic apparatus. Then, an improved power supply adapter capable of locating the projecting plug stably is desired.

SUMMARY OF THE INVENTION

Accordingly, an object of the present invention is to provide a power supply adapter capable of firming a plug module thereof. The power supply adapter comprises a casing defining at least one inserting groove therein, at least one resilient piece disposed in the casing and having a locating portion and a resisting portion extended gradually upward from the locating portion, and a plug module rotatablely disposed in the casing. The plug module has at least one retaining block disposed in the inserting groove of the casing and capable of rotating around the resisting portion of the resilient piece. A connecting terminal runs through the retaining block to form an inserting portion and a projecting portion at opposite sides of the retaining block. The projecting portion is capable of compressing the resisting portion when the inserting portion is raised erectly to be exposed externally from the inserting groove.

As described above, the power supply adapter utilizes the resilient piece to fix the inserting portion of the plug module because the resisting portion exerts elastic force upon the projecting portion when the projecting portion compresses the resisting portion, so as that the inserting portion is capable of stably connecting with other electronic apparatus.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

Figure 1:
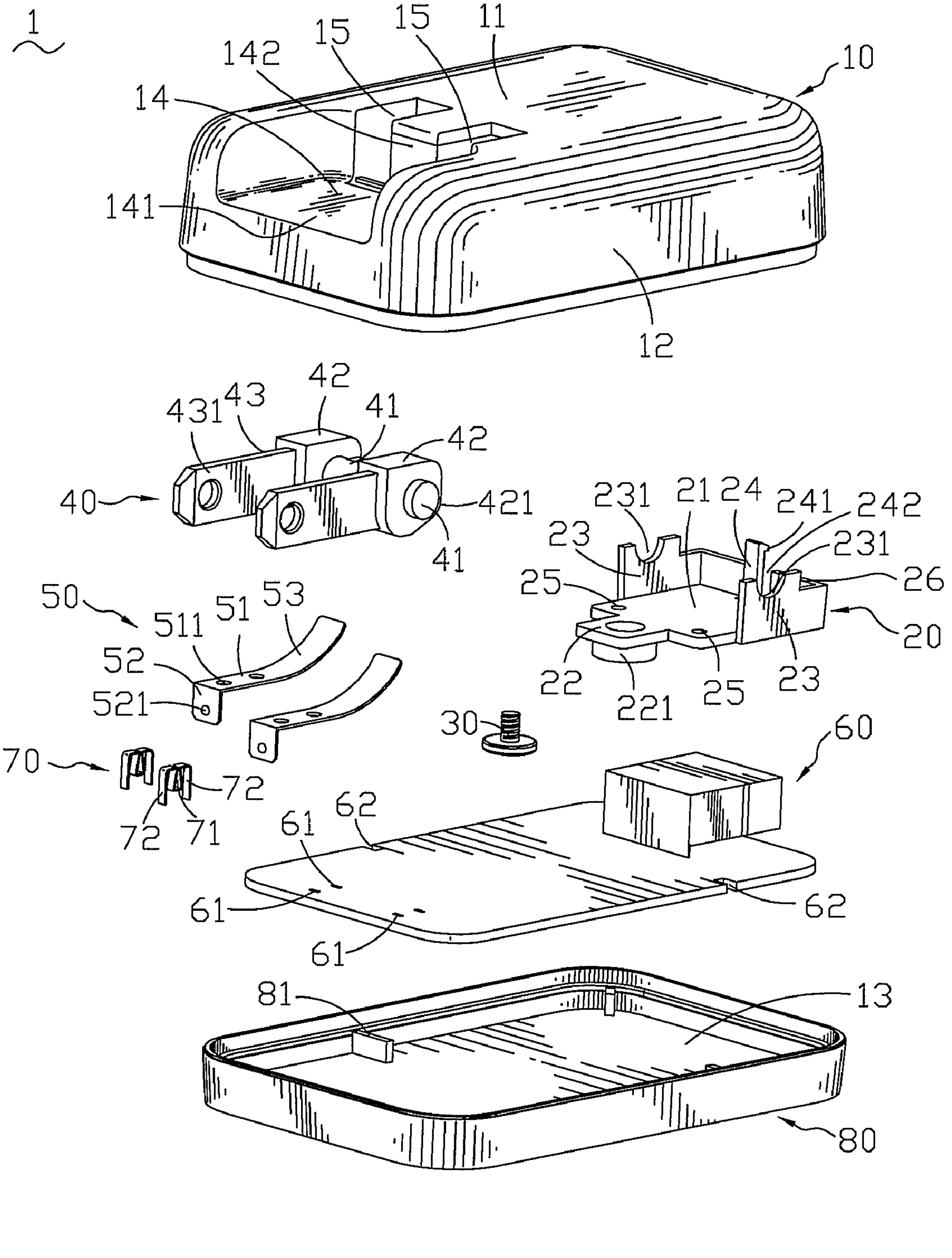
FIG. 1 is an exploded view of a power supply adapter according to an embodiment of the present invention.

Referring to FIG. 1, a power supply adapter 1 in accordance with the present invention includes an upper casing 10, a bearing frame 20, a locating screw 30, a plug module 40, a pair of resilient pieces 50, a printed circuit board (PCB) 60, a pair of conductive members 70 and a lower casing 80 which can couple with the upper casing 10 to form a receiving space 13 therebetween for receiving the bearing frame 20, the locating screw 30, the plug module 40, the two resilient pieces 50, the PCB 60 and the two conductive members 70 therein.

Figure 2:
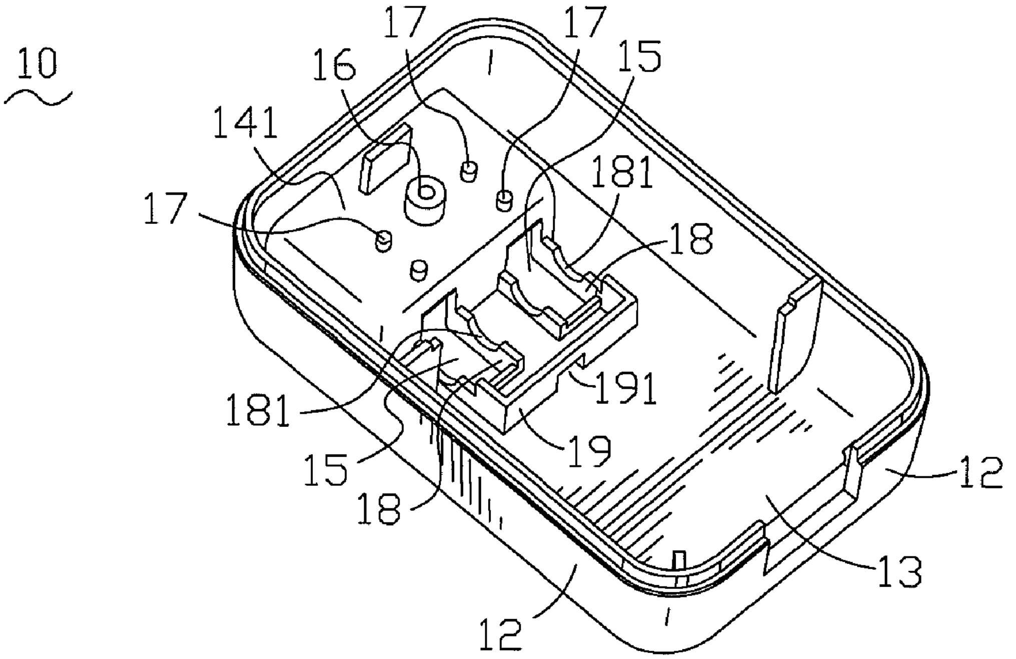
FIG. 2 is a perspective view of an upper casing of the power supply adapter of FIG. 1 while viewed from inside of the upper casing.

With reference to FIG. 1 and FIG. 2, the upper casing 10 has a top board 11 and two sideboards 12 extended downward from two lateral sides of the top board 11 respectively. Partial material of the front portion of the top board 11 is removed so as to form a bottom portion 141, a rear portion 142 and two sidewalls (not labeled). The bottom portion 141, the rear portion 142 and the two sidewalls define in conjunction a receiving recess 14. Two separate inserting grooves 15 are defined on the top board 11 and communicate with inside of the upper casing 10. The inserting grooves 15 are arranged in the rear portion 142 respectively to communicate with the receiving recess 14. A first hollow locating pillar 16 is protruded upon an opposite side of the bottom portion 141 at a substantially middle portion thereof. Two pairs of locating posts 17 are also extended from the side, upon which the first locating pillar 16 is protruded, of the bottom portion 141. One pair of the locating posts 17 is disposed at opposite sides of the first locating pillar 16 and the other pair of the locating posts 17 is adjacent to the rear portion of the opposite side of the bottom portion 141. A reverse side of the top board 11 defines two pairs of first vertical plates 18 which protrude downward. Every one pair of the first vertical plates 18 is disposed at opposite sides of the inserting groove 15. Each of the vertical plates 18 defines a first semicircular concave gap 181 on a bottom portion thereof. A front end of each of the vertical plates 18 connects with a reverse side of the rear portion 142. A retaining plate 19 extends downward from the reverse side of the top board 11. Two ends of the retaining plate 19 respectively connect with rear ends of the vertical plates 18 adjacent to the sideboards 12. The retaining plate 19 defines a retaining hole 191 at a top portion thereof.

Referring to FIG. 1, the bearing frame 20 has a base wall 21, two sidewalls 23 extending upward from opposite sides of the base wall 21 and a rear wall 26 extending upward from a rear side of the base wall 21 and connecting with the sidewalls 23. A front portion of the base wall 21 defines two first locating holes 25 at opposite sides thereof. The front portion of the base wall 21 stretches forwardly from a middle portion thereof to form a tongue portion 22 defining a second hollow locating pillar 221 downward. Each of the sidewalls 23 defines a second semicircular concave gap 231 thereon. An opening 242 is defined in the middle of the rear wall 26. A locking portion 24 extends upward from the rear of the base wall 21 corresponding to the middle position of the opening 242. A top end of the locking portion 24 protrudes backward to form a hook portion 241 thereon.

Figure 3:
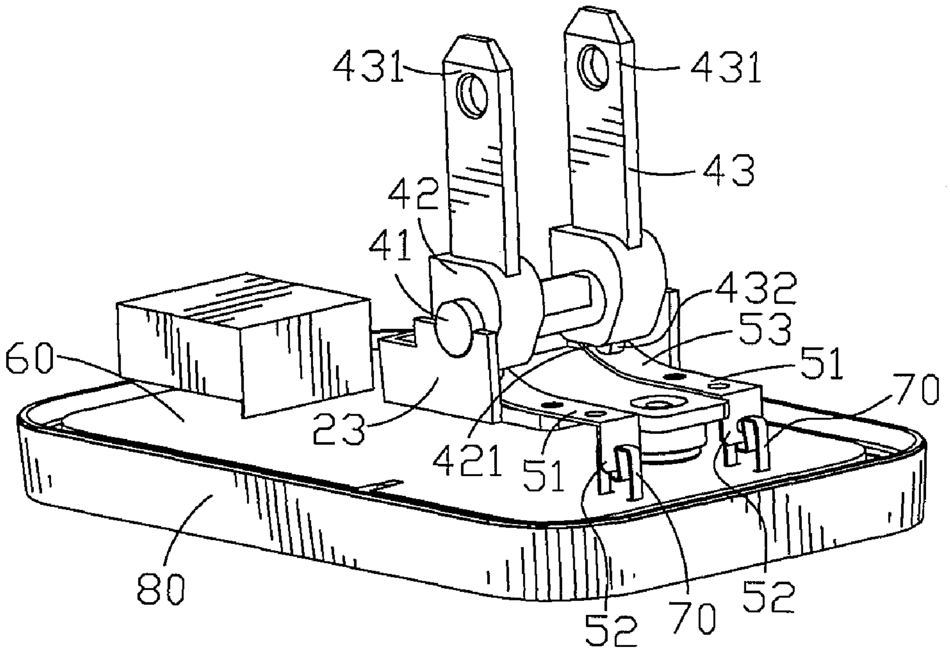
FIG. 3 is an assembly view of the power supply adapter without the upper casing.
Figure 4:
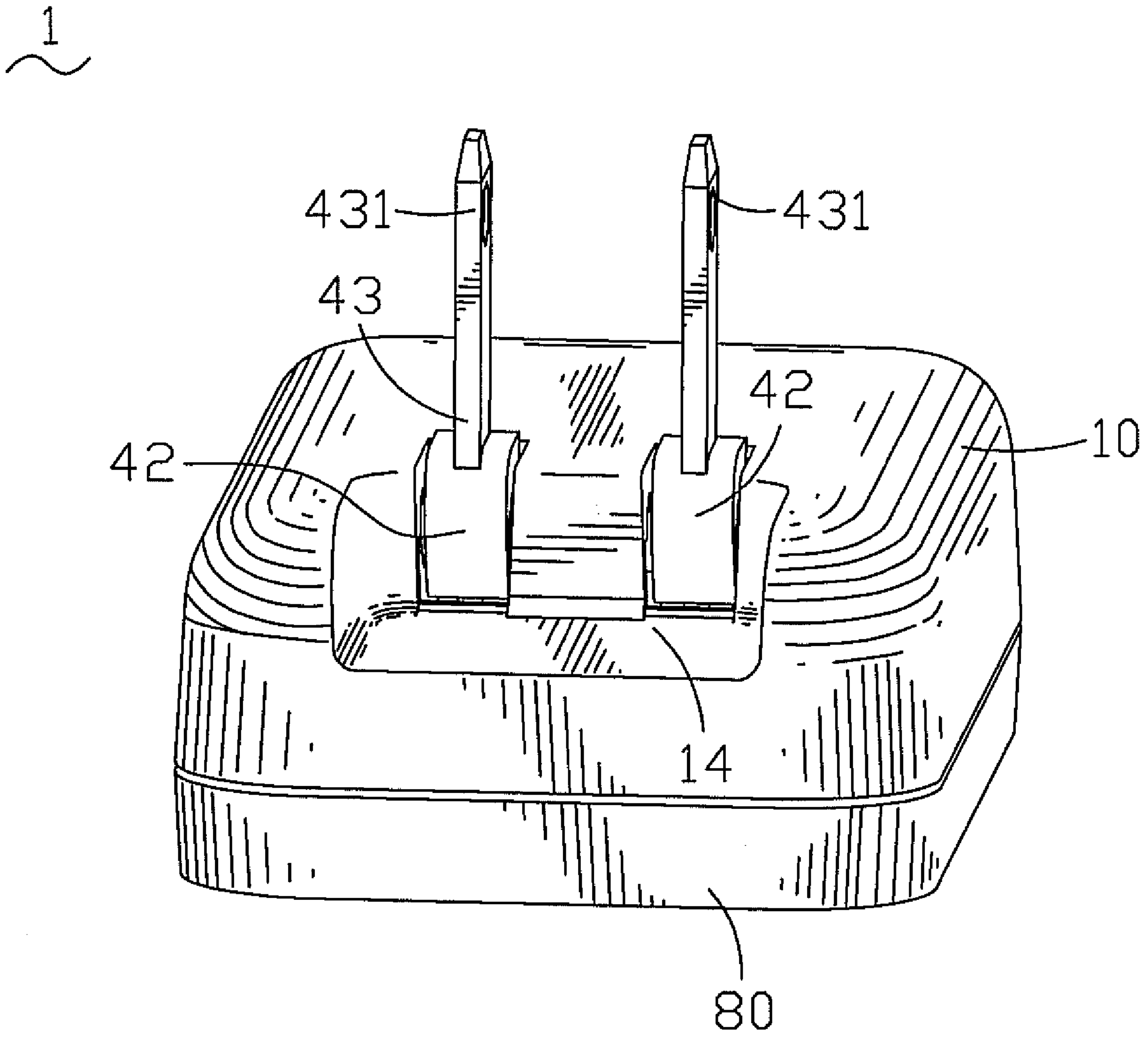
FIG. 4 is a perspective view of the power supply adapter of FIG. 1.

With reference to FIG. 1 and FIG. 3, the plug module 40 includes a pair of retaining blocks 42 keeping a distance from each other. Each of the retaining blocks 42 is of substantially square-shape and defines an arc-shaped surface 421 which smoothly connects a bottom surface with a rear surface of the retaining block 42. A central shaft 41 transversely passes through the center of the retaining blocks 42 and two ends thereof respectively protrude outside. Two sheet-shaped connecting terminals 43 longitudinally run through the middle of the retaining blocks 42 and the central shaft 41 respectively. The connecting terminal 43 has an inserting portion 431 at front of the retaining block 42 and a projecting portion 432 extended out of the back portion of the retaining block 42.

Referring to FIG. 1, each of the resilient pieces 50 is conductive and has a planar locating portion 51 defining two second locating holes 511 therein. A front end of the locating portion 51 perpendicularly extends downward to form a contact portion 52. A protrusion 521 is projected forwardly from the contact portion 52. An arc-shaped resisting portion 53 smoothly extends rearward and upward from a rear end of the locating portion 51.

The PCB 60 defines two pairs of inserting holes 61 at a front end thereof and a plurality of fixing notches 62 at opposite sides thereof.

Each conductive member 70 is of substantial M-shape. The conductive member 70 has a receiving groove 71 which gradually becomes wider and wider from top to bottom. Two inserting pins 72 extend downward from opposite sides of the receiving groove 71.

The lower casing 80 defines a plurality of wedging blocks 81 on a bottom surface thereof and connected with opposite sides thereof.

Please refer to FIG. 1 to FIG. 4. In assembly, the locating portions 51 of the resilient pieces 50 are respectively disposed on the opposite sides of the base wall 21 of the bearing frame 20. The resisting portion 53 is disposed above the base wall 21. The second locating hole 511 disposed at the rear of the locating portion 51 and the first locating hole 25 of the bearing frame 20 have the same axle center. The plug module 40 is placed on the bearing frame 20. The two ends of the central shaft 41 are respectively received in the second concave gaps 231. The retaining blocks 42 are disposed on the resisting portions 53. The arc-shaped surface 421 of the retaining block 42 touches a surface of the resisting portion 53. Then the combination of the bearing frame 20, the plug module 40 and the resilient pieces 50 couples with the upper casing 10. The first locating pillar 16 is inserted in the second locating pillar 221 of the bearing frame 20. Then the locating screw 30 is mounted in the second locating pillar 221 for fixing the bearing frame 20 with the upper casing 10. The locating posts 17 are respectively disposed in both the second locating holes 511 and the first locating holes 25. The vertical plates 18 adjacent to the sideboard 12 are coupled with the sidewalls 23 of the bearing frame 20. The two ends of the central shaft 41 are placed in the first concave gaps 181 and the second concave gaps 231. The retaining blocks 42 are disposed in the inserting grooves 15 and the inserting portions 431 respectively protrude outside. The hook portion 241 of the bearing frame 20 is located in the retaining hole 191 of the upper casing 10. The conductive members 70 are located on the PCB 60 for electrical connection. The inserting pins 72 are respectively inserted in the inserting holes 61. Then the contact portions 52 of the resilient pieces 50 are received in the receiving grooves 71. The PCB 60 is mounted in the lower casing 80. The wedging blocks 81 engage with the fixing notches 62.

Figure 5:
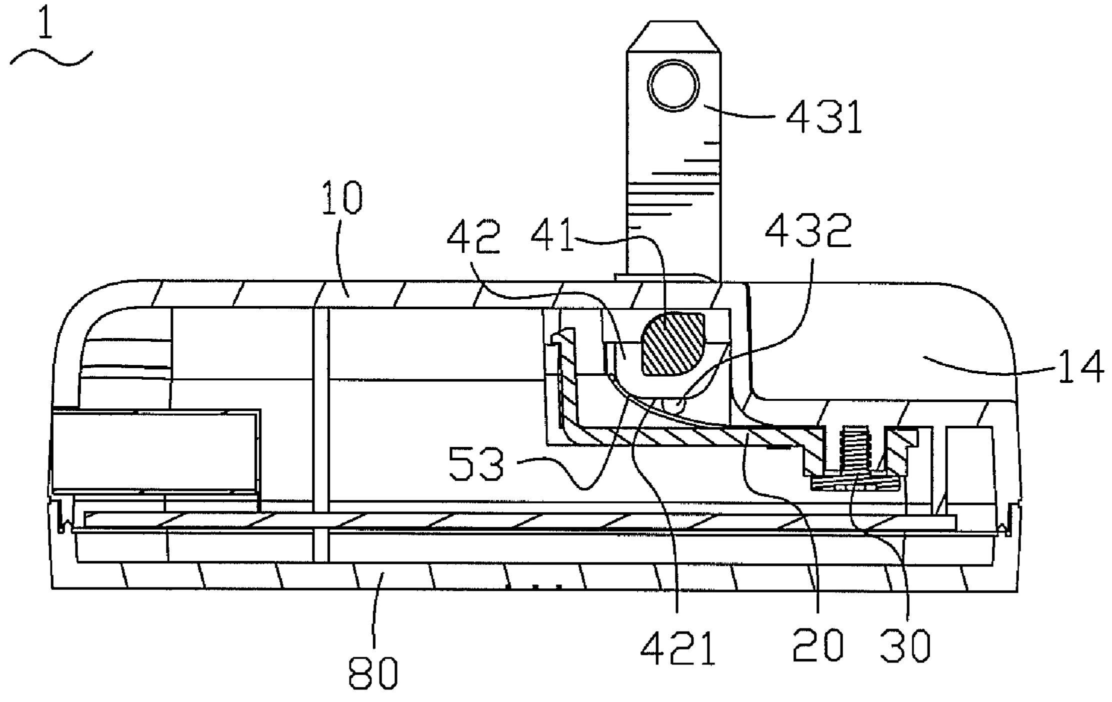
FIG. 5 is a cross-sectional view of the power supply adapter of which plug module is raised.
Figure 6:
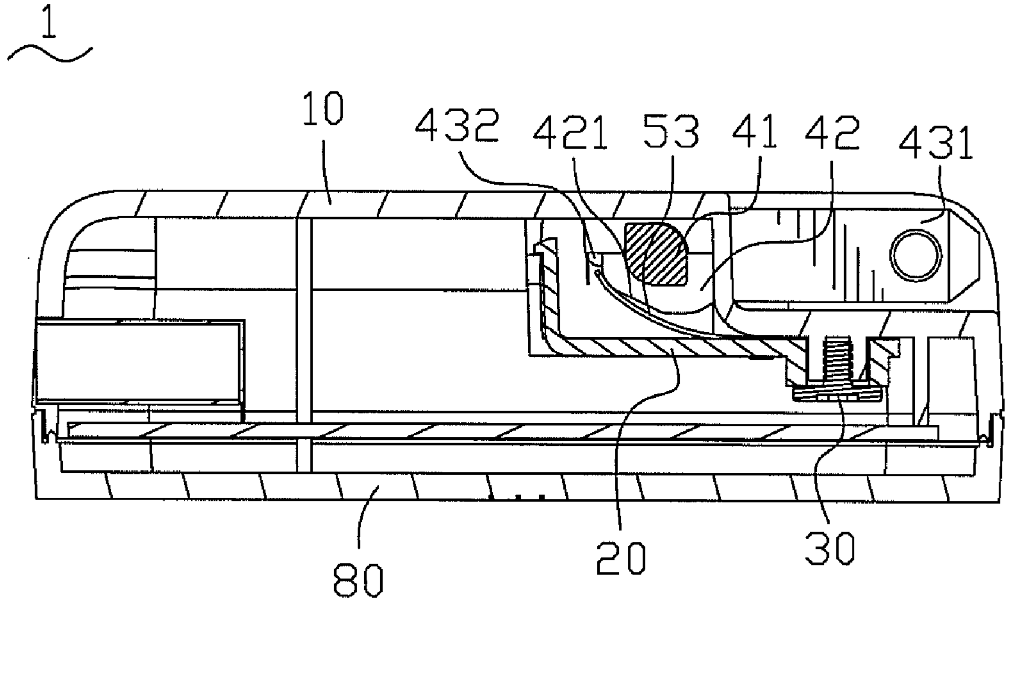
FIG. 6 is a cross-sectional view of the power supply adapter of which the plug module is folded to a stowed position.

Please refer to FIG. 5 and FIG. 6. When the power supply adapter 1 is in use, the inserting portions 431 of the connecting terminals 43 of the plug module 40 are raised erectly to connect with other electronic apparatus. At this time, the projecting portions 432 of the connecting terminals 43 compress the resisting portions 53 of the resilient pieces 50, which not only enable the electrical connection between the PCB 60 and the connecting terminals 43, but also ensure the inserting portions 431 stably connect with the electronic apparatus because of the resisting portions 53 exerting elastic force upon the projecting portions 432. When the power supply adapter 1 is not in use, the inserting portions 431 are laid and received in the receiving recess 14 of the upper casing 10 for conveniently being carried. Meanwhile, the projecting portions 432 come off the resisting portions 53.

As described above, the power supply adapter 1 of the present invention utilizes the resilient pieces 50 to attain electrical connection with the PCB 60 and simultaneously fix the inserting portions 431 of the plug module 40, so that the inserting portions 431 are capable of stably connecting with the electronic apparatus.

Figure 7:
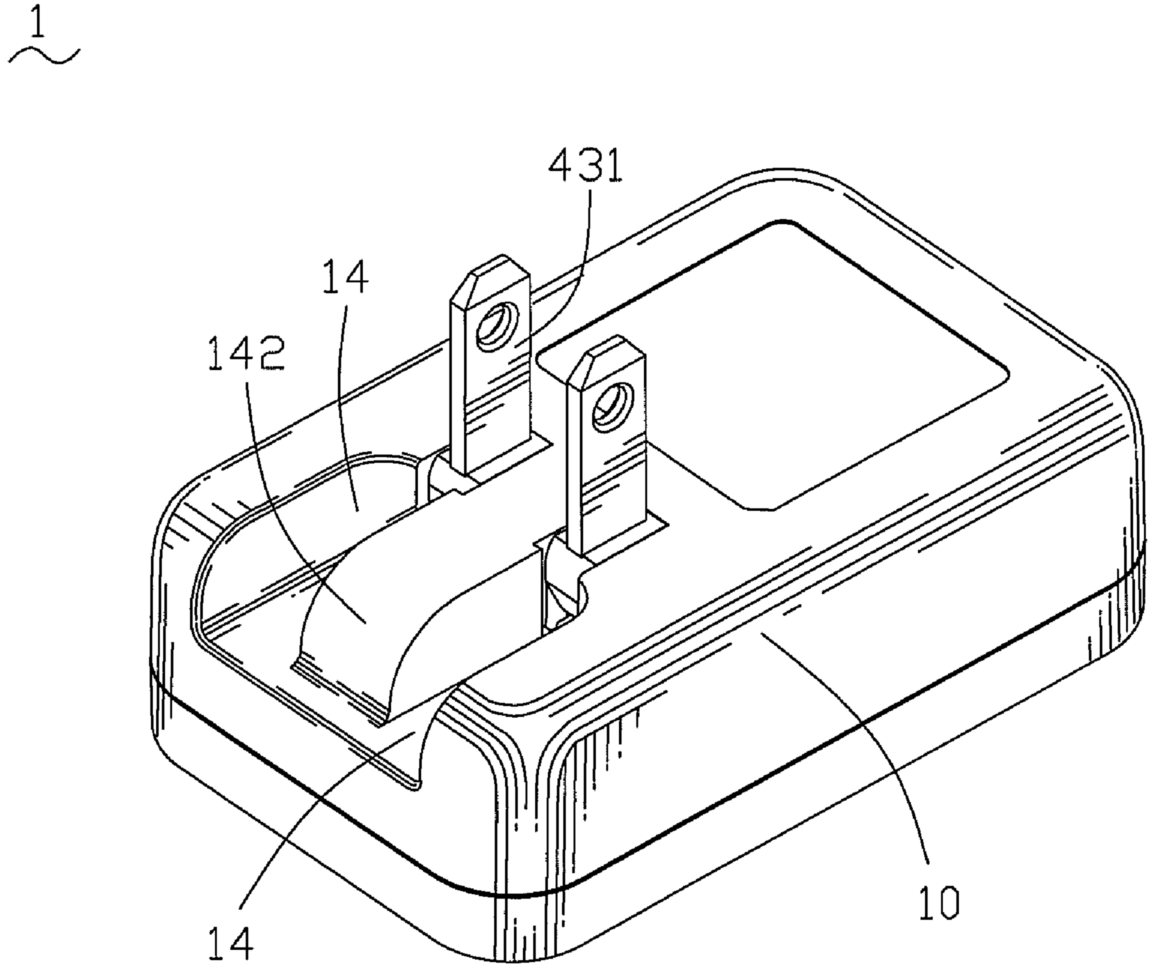
FIG. 7 is a perspective view of a power supply adapter according to another embodiment of the present invention.

The foregoing description of the present invention has been presented for purposes of illustration and description. It is not intended to be exhaustive or to limit the invention to the precise form disclosed, and obviously many modifications and variations are possible in light of the above teaching. Such as another embodiment shown in FIG. 7, in which the rear portion 142 of the upper casing 10 extends forward into the receiving recess 14 to divide the receiving recess 14 into two. When the power supply adapter 1 is not in use, the inserting portions 431 are received in the corresponding receiving recesses 14 and located at two sides of the rear portion 142 so as to prevent the inserting portions 431 from being broken and be conveniently carried. Such modifications and variations that may be apparent to those skilled in the art are intended to be included within the scope of this invention as defined by the accompanying claims.

What is claimed is:

1. A power supply adapter, comprising:

a casing defining at least one inserting groove therein;

at least one resilient piece disposed in the casing, and having a locating portion and a resisting portion extended gradually upward from the locating portion; and a plug module rotatablely disposed in the casing, the plug module having at least one retaining block disposed in the inserting groove of the casing and capable of rotating around the resisting portion of the resilient piece, a connecting terminal running through the retaining block to form an inserting portion and a projecting portion at opposite sides of the retaining block, the projecting portion being capable of compressing the resisting portion when the inserting portion is raised erectly to be exposed externally from the inserting groove;

wherein the casing has a top board which is recessed partially to form a receiving recess communicating with the inserting groove, the receiving recess has a bottom portion defining a plurality of locating posts on a reverse side thereof, the locating portion of the resilient piece defines a plurality of locating holes for receiving the locating posts therein.

2. The power supply adapter as claimed in claim 1, wherein the retaining block of the plug module defines an arc-shaped surface to engage with the resisting portion that is also arc-shaped.

3. The power supply adapter as claimed in claim 1, wherein the casing defines a rear portion connected with the top board and dividing the receiving recess into two for receiving the corresponding inserting portion of the plug module therein.

4. The power supply adapter as claimed in claim 1, wherein the top board defines at least a pair of vertical plates disposed at opposite sides of the inserting groove on a reverse side thereof, a bearing frame fixed in the casing has a base wall and two sidewalls extending from opposite sides of the base wall, a pair of accommodating spaces is defined between the vertical plates and the sidewalls, a central shaft passes through the retaining block and the connecting terminal and two ends thereof are respectively disposed in the accommodating spaces.

5. The power supply adapter as claimed in claim 4, wherein the reverse side of the bottom portion defines a first hollow locating pillar, the base wall of the bearing frame defines a second hollow locating pillar for receiving the first hollow locating pillar therein, and a locating element is inserted in the second hollow locating pillar.

6. The power supply adapter as claimed in claim 4, wherein the reverse side of the top board defines a retaining plate defining a retaining hole, the bearing frame defines a rear wall extending upward from a rear side of the base wall, a locking portion extends upward at the rear wall, a top end of the locking portion protrudes to form a hook portion located in the retaining hole.

7. The power supply adapter as claimed in claim 4, wherein the locating portion of the resilient piece is disposed on the base wall of the bearing frame, the resisting portion is disposed above the base wall, while the locating portion and the base wall are fixed on the reverse side of the bottom portion together.

8. The power supply adapter as claimed in claim 1, wherein the resilient piece is conductive and electrically connected with a printed circuit board which is also disposed in the casing.

9. The power supply adapter as claimed in claim 8, wherein the locating portion extends downward to form a contact portion opposite to the resisting portion, at least one conductive member located on the printed circuit board has a receiving groove for receiving the contact portion.

10. The power supply adapter as claimed in claim 9, wherein the conductive member is in substantial M-shape, the receiving groove gradually becomes wider and wider from top to bottom, and two inserting pins extend downward from opposite sides of the receiving groove.

11. The power supply adapter as claimed in claim 9, wherein the contact portion projects to form a protrusion thereon.

12. The power supply adapter as claimed in claim 5, wherein the locating element is a screw.

* * * * *